(12) United States Patent
Tan et al.

(10) Patent No.: US 10,656,202 B1
(45) Date of Patent: May 19, 2020

(54) ELECTRONIC DEVICE INCLUDING INTEGRATED CIRCUIT WITH DEBUG CAPABILITIES

(71) Applicant: Xilinx, Inc., San Jose, CA (US)

(72) Inventors: Sing-Keng Tan, San Jose, CA (US);
Xiaobao Wang, Cupertino, CA (US);
Andrew Tabalujan, Milpitas, CA (US);
Gubo Huang, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 69 days.

(21) Appl. No.: 16/137,888

(22) Filed: Sep. 21, 2018

(51) Int. Cl.
*G01R 31/317* (2006.01)
*G01R 31/3185* (2006.01)

(52) U.S. Cl.
CPC . *G01R 31/31705* (2013.01); *G01R 31/31723* (2013.01); *G01R 31/318572* (2013.01)

(58) Field of Classification Search
CPC ........ G01R 31/31705; G01R 31/31723; G01R 31/318572
USPC ........................................ 714/724, 718, 719
See application file for complete search history.

(56) References Cited

U.S. PATENT DOCUMENTS

| | | | | |
|---|---|---|---|---|
| 6,125,217 A * | 9/2000 | Paniccia | ................. | G06F 1/105 385/129 |
| 6,662,313 B1 * | 12/2003 | Swanson | ........ | G01R 31/318522 714/30 |
| 7,401,246 B2 * | 7/2008 | Martin | ...................... | G06F 1/10 713/400 |
| 8,832,511 B2 * | 9/2014 | Chen | ............... | G01R 31/318536 714/733 |
| 9,106,229 B1 * | 8/2015 | Hutton | ................. | H03K 19/173 |
| 10,229,748 B1 * | 3/2019 | Gerhard | ................. | G11C 29/38 |
| 10,263,815 B1 * | 4/2019 | Geary | ............... | H04L 25/03878 |
| 2005/0154947 A1 * | 7/2005 | Taniguchi | ........ | G01R 31/31705 714/726 |
| 2010/0091537 A1 * | 4/2010 | Best | ...................... | G11C 11/406 365/51 |
| 2010/0124130 A1 * | 5/2010 | Oh | ....................... | G11C 7/1051 365/193 |

(Continued)

OTHER PUBLICATIONS

Durupt et al., IJTAG supported 3D DFT using Chiplet-Footprints for testing Multi-Chips Active Interposer System, 2016, IEEE, pp. 1-6. (Year: 2016).*

(Continued)

*Primary Examiner* — John J Tabone, Jr.
(74) *Attorney, Agent, or Firm* — Patterson + Sheridan, LLP

(57) ABSTRACT

Examples of the present disclosure provide example devices that include an integrated circuit that has debugging capability. In some examples, a device includes an integrated circuit die. The integrated circuit die includes an input/output (IO) base cell and a debug port. The IO base cell has an interface node and a feedback node. The interface node is configured to be coupled to memory, such as via an interposer, for communication therebetween. The IO base cell is configurable to selectively output to the feedback node a signal that is on the interface node. The debug port has an input node and an output node. The input node is electrically connected to the feedback node. The debug port is configurable to selectively output to the output node a signal that is on the input node. The output node is configured to be coupled to a pin exterior to the integrated circuit die.

20 Claims, 6 Drawing Sheets

(56) References Cited

U.S. PATENT DOCUMENTS

| | | | | |
|---|---|---|---|---|
| 2011/0078222 | A1* | 3/2011 | Wegener | H03M 7/30 |
| | | | | 708/203 |
| 2011/0292950 | A1* | 12/2011 | Nguyen | H03K 19/0175 |
| | | | | 370/537 |
| 2012/0204073 | A1* | 8/2012 | Whetsel | G01R 31/318536 |
| | | | | 714/727 |
| 2013/0038380 | A1* | 2/2013 | Cordero | G06F 1/10 |
| | | | | 327/524 |
| 2014/0189457 | A1* | 7/2014 | Mak | G01R 31/31716 |
| | | | | 714/745 |
| 2015/0365079 | A1* | 12/2015 | Tsai | H03K 5/003 |
| | | | | 327/333 |
| 2016/0091941 | A1* | 3/2016 | C.R. | G06F 1/266 |
| | | | | 713/310 |
| 2016/0293548 | A1* | 10/2016 | Karp | H01L 25/0655 |
| 2018/0284186 | A1* | 10/2018 | Chadha | H01L 24/13 |
| 2019/0114535 | A1* | 4/2019 | Ng | G06N 3/063 |
| 2019/0164623 | A1* | 5/2019 | Gerhard | G11C 29/36 |
| 2019/0303033 | A1* | 10/2019 | Noguera Serra | G06F 3/0683 |
| 2019/0303268 | A1* | 10/2019 | Ansari | G06F 11/2733 |
| 2019/0303311 | A1* | 10/2019 | Bilski | G06F 13/1663 |
| 2019/0303328 | A1* | 10/2019 | Balski | G06F 15/7825 |
| 2019/0318991 | A1* | 10/2019 | Chuah | H01L 23/5226 |

OTHER PUBLICATIONS

Huang et al., At-Speed BIST for Interposer Wires Supporting On-the-Spot Diagnosis, 2013, IEEE, pp. 67-72. (Year: 2013).*

* cited by examiner

ELECTRONIC DEVICE INCLUDING INTEGRATED CIRCUIT WITH DEBUG CAPABILITIES

TECHNICAL FIELD

Examples of the present disclosure generally relate to an electronic device including an integrated circuit and, in particular, to an electronic device including an integrated circuit having debug capabilities.

BACKGROUND

In the integrated circuit (IC) industry, downscaling of features within an integrated circuit die has corresponded with the generation of various package structures. Some package structures include one or more integrated circuit dies attached to an interposer, which can, depending on the configuration of the integrated circuit dies, result in what is referred to as a two and a half dimensional (2.5D) or three dimensional (3D) package structure. In some instances, such package structures may be referred to as stacked silicon interconnect technology (SSIT).

Memory has also become structurally de-coupled from other integrated circuitry with which the memory communicates. That is, memory can be formed on a separate die from the other integrated circuitry. Hence, in some applications, one or more memory dies are formed and attached to an interposer, and another integrated circuit die is also formed and attached to the interposer. The memory die and the other integrated circuit die may be able to communicate with each other via the interposer.

SUMMARY

Examples of the present disclosure provide example electronic devices that include an integrated circuit that has debugging capability. Various devices described herein can facilitate debugging of memory when input/output circuits are on a separate integrated circuit die from the memory.

An example of the present disclosure is a device. The device includes a first integrated circuit die. The first integrated circuit die includes a first input/output (IO) base cell and a first debug port. The first IO base cell has a first interface node and a first feedback node. The first interface node is configured to be coupled to memory for communication between the first IO base cell and the memory. The first IO base cell is configurable to selectively output to the first feedback node a signal that is on the first interface node. The first debug port has a first input node and a first output node. The first input node is electrically connected to the first feedback node. The first debug port is configurable to selectively output to the first output node a signal that is on the first input node. The first output node is configured to be coupled to a first pin exterior to the first integrated circuit die.

Another example of the present disclosure is a method of method of debugging. A first debug port on a first integrated circuit die is configured to selectively output a first selected signal provided to one of first multiple input nodes of the first debug port. A first input/output (IO) base cell on the first integrated circuit die is configured to provide a first feedback signal to one of the first multiple input nodes of the first debug port. An operation is performed on the first integrated circuit die and a second integrated circuit die. The operation includes a write operation to memory on the second integrated circuit die through the first IO base cell, a read operation to the memory through the first IO base cell, or a combination thereof. During performing the operation, the first feedback signal is provided to the one of the first multiple input nodes of the first debug port. The first selected signal is output to a first output node of the first debug port based on the configuration of the first debug port.

Yet another example of the present disclosure is a device. The device includes a first integrated circuit die, a second integrated circuit die, and an interposer. The first integrated circuit die includes a first input/output (IO) base cell, a receiver strobe cell, and a first debug port. The second integrated circuit die includes memory. The first integrated circuit die and the second integrated circuit die are mechanically attached and electrically coupled to the interposer. Each of the first IO base cell and the receiver strobe cell is configured to communicate with the memory via the interposer. The first IO base cell has a feedback node electrically coupled to one of first multiple input nodes of the first debug port, and is configurable to selectively transmit a signal on the feedback node. The receiver strobe cell has a read strobe observation node electrically coupled to one of the first multiple input nodes of the first debug port. The first debug port has a first output node. The first debug port is configurable to selectively output to a first exterior conductive element a first selected signal on a selected one of the first multiple input nodes of the first debug port.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
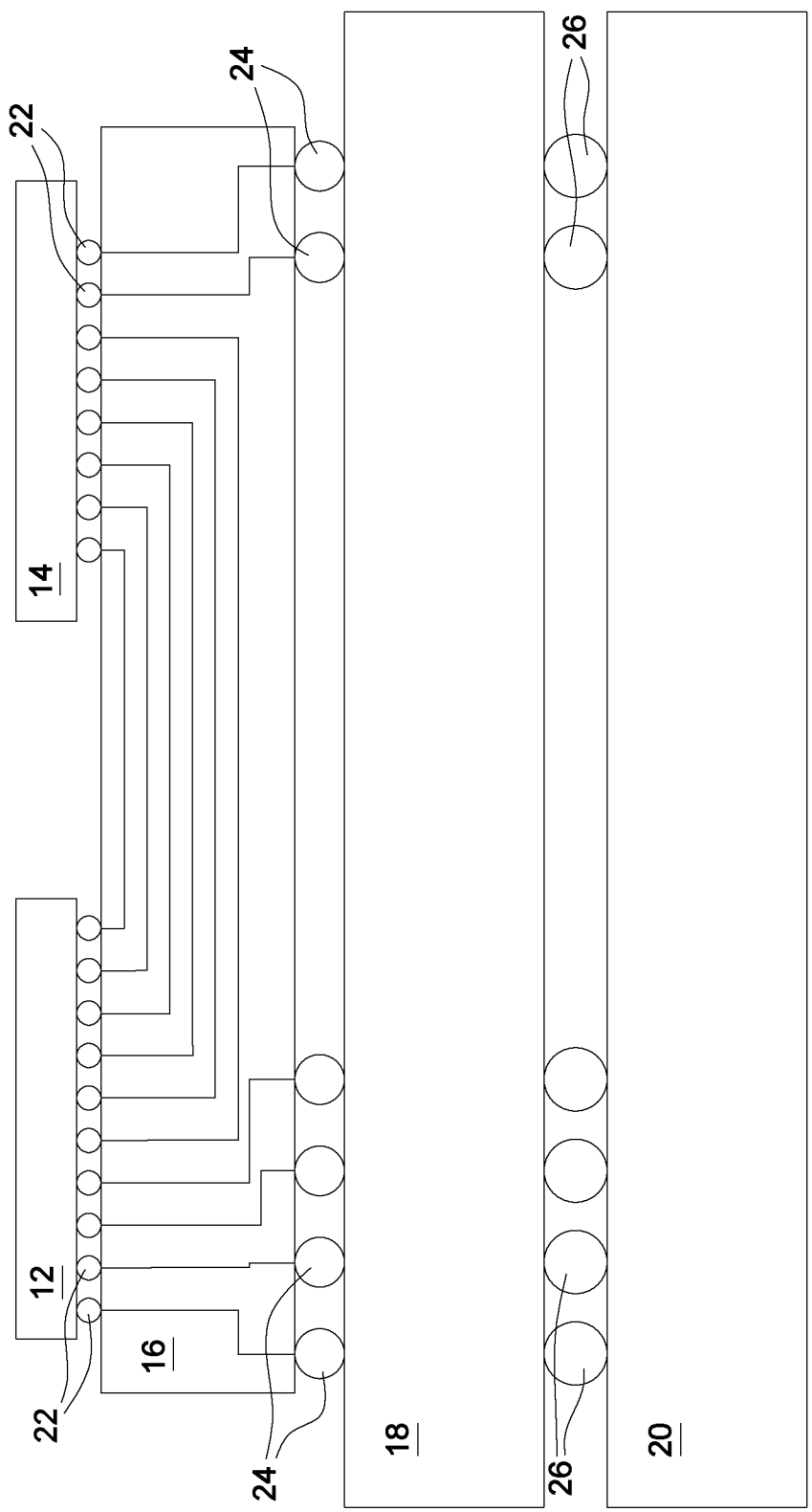
FIG. 1 is a simplified schematic view of an electronic device, in accordance with examples of the present disclosure of the present disclosure.

Examples of the present disclosure provide example electronic devices that include an integrated circuit that has debugging capability. Generally, the electronic device includes at least two integrated circuit dies mechanically attached and electrically coupled to an interposer, and the integrated circuit dies are communicatively coupled together via the interposer. In some specific examples, a first integrated circuit die includes input/output (IO) base cells and a receiver strobe cell for communicating with a second integrated circuit die, which includes synchronous memory (e.g., synchronous dynamic random access memory (DRAM)). The IO base cells are configurable to selectively feedback signals transmitted to or received from the second integrated circuit die to debug ports on the first integrated circuit die. The debug ports are configurable to selectively output signals received at the debug ports to conductive elements, which may be probed to obtain the signals. In some further specified examples, the conductive elements may be on a printed circuit board (PCB) to which the interposer is attached, and hence, the signals are passed via the interposer to the conductive elements. Other signals, e.g., analog signals, generated internal to the first integrated circuit die may also be provided to and selectively output by the debug ports. Signals can be obtained at the conductive elements contemporaneously with the debug operations performed in the first and second integrated circuit dies with easy and quick access. Further, timing of synchronous signals can be quantified; phase locked loop (PLL) clock jitter performance can be characterized; and analog bias voltage levels can be measured.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described.

FIG. 1 illustrates a simplified schematic view of an electronic device, in accordance with examples of the present disclosure. The electronic device includes a first integrated circuit die 12, a second integrated circuit die 14, an interposer 16, a package substrate 18, and a printed circuit board (PCB) 20. The first integrated circuit die 12 and the second integrated circuit die 14 are each electrically coupled and mechanically attached to the interposer 16 by conductive bumps 22. The interposer 16 is electrically coupled and mechanically attached to the package substrate 18 by conductive bumps 24. The package substrate 18 is electrically coupled and mechanically attached to the PCB 20 by conductive balls 26

The first integrated circuit die 12 can be or include a processor, an application specific integrated circuit (ASIC), a programmable integrated circuit (e.g., field-programmable gate array (FPGA) or complex programmable logic device (CPLD)), or the like. In some examples, the first integrated circuit die 12 is a System-on-Chip (SoC). For example, the SoC can include a plurality of processor cores in a processor system, programmable logic, and a Network-on-Chip (NoC) interconnecting the processor system and programmable logic.

The second integrated circuit die 14 can be or include memory, such as synchronous memory. In some examples, the second integrated circuit die 14 includes synchronous dynamic random access memory (SDRAM), the like, or a combination thereof. The second integrated circuit die 14 can implement a standard or proprietary access format, such as High Bandwidth Memory DRAM (HBMDRAM). In some examples, multiple memory dies can be stacked in a three-dimensional structure in the place of or in addition to the second integrated circuit die 14.

The interposer 16 can include a silicon substrate or the like on which one or more redistribution layers are formed. Each redistribution layer can be disposed on a side of the substrate (e.g., silicon substrate). Each redistribution layer can include one or more metal layers in one or more dielectric layers, and each metal layer can be patterned to route various signals. One or more through-substrate vias (TSVs) can be disposed through the substrate, and the TSVs can electrically couple metal layers of redistribution layers on different sides of the substrate.

The package substrate 18 can include a core or be coreless. For example, the package substrate 18 can include a core (such as of a pre-preg layer) with any number of resin layers on a front-side and back-side of the core, where a metal layer may be disposed and routed between and among the resin layers. In other examples, the package substrate 18 can include any number of resin layers and metal layers, where the package substrate 18 does not include a core. The PCB 20 can include any number of dielectric layers with a metal layer patterned thereon. Each of the dielectric layers can be a pre-preg layer having a metal foil that is patterned to be the metal layer, and the pre-preg layers can be joined together to form the PCB 20.

The conductive bumps 22 include metal pillars with solder that is reflowed to attach the first integrated circuit die 12 and the second integrated circuit die 14 to the interposer 16. The conductive bumps 22 can be microbumps, for example. The conductive bumps 24 include solder that is reflowed to attach the interposer 16 to the package substrate 18. The conductive bumps 24 can be controlled collapsible chip connection (C4) bumps. The conductive balls 26 include solder that is reflowed to attach the package substrate 18 to the PCB 20. The conductive balls 26 can be ball grid array (BGA) balls.

The first integrated circuit die 12 is configured to communicate with the second integrated circuit die 14 via the conductive bumps 22 and one or more redistribution layer on the interposer 16. In some examples, input/output connections of the second integrated circuit die 14 are electrically coupled to corresponding connections of the first integrated circuit die 12 via conductive bumps 22 and one or more redistribution layer on the interposer 16, and power connections of the second integrated circuit die 14 are electrically coupled to power nodes on the PCB 20 via conductive bumps 22, one or more redistribution layers and TSVs of the interposer 16, conductive bumps 24, one or more metal layers and/or vias of the package substrate 18, and conductive balls 26. The first integrated circuit die 12 and the second integrated circuit die 14 are coupled together to permit communications therebetween, such as the first integrated circuit die 12 transmitting read and/or write commands to the second integrated circuit die 14 with responses to such commands being transmitted from the second integrated circuit die 14 to the first integrated circuit die 12. In such examples, the read and/or write commands, and responses thereto, can be synchronous. The communication interface between the first integrated circuit die 12 and the second integrated circuit die 14 can be a High Bandwidth Memory (HBM) interface. In some examples, some input/output connections and power connections of the first integrated circuit die 12 are electrically coupled to input/output nodes and power nodes, respectively, on the PCB 20 via conductive bumps 22, one or more redistribution layers and TSVs of the interposer 16, conductive bumps 24, one or more metal layers and/or vias of the package substrate 18, and conductive balls 26.

Figure 2:
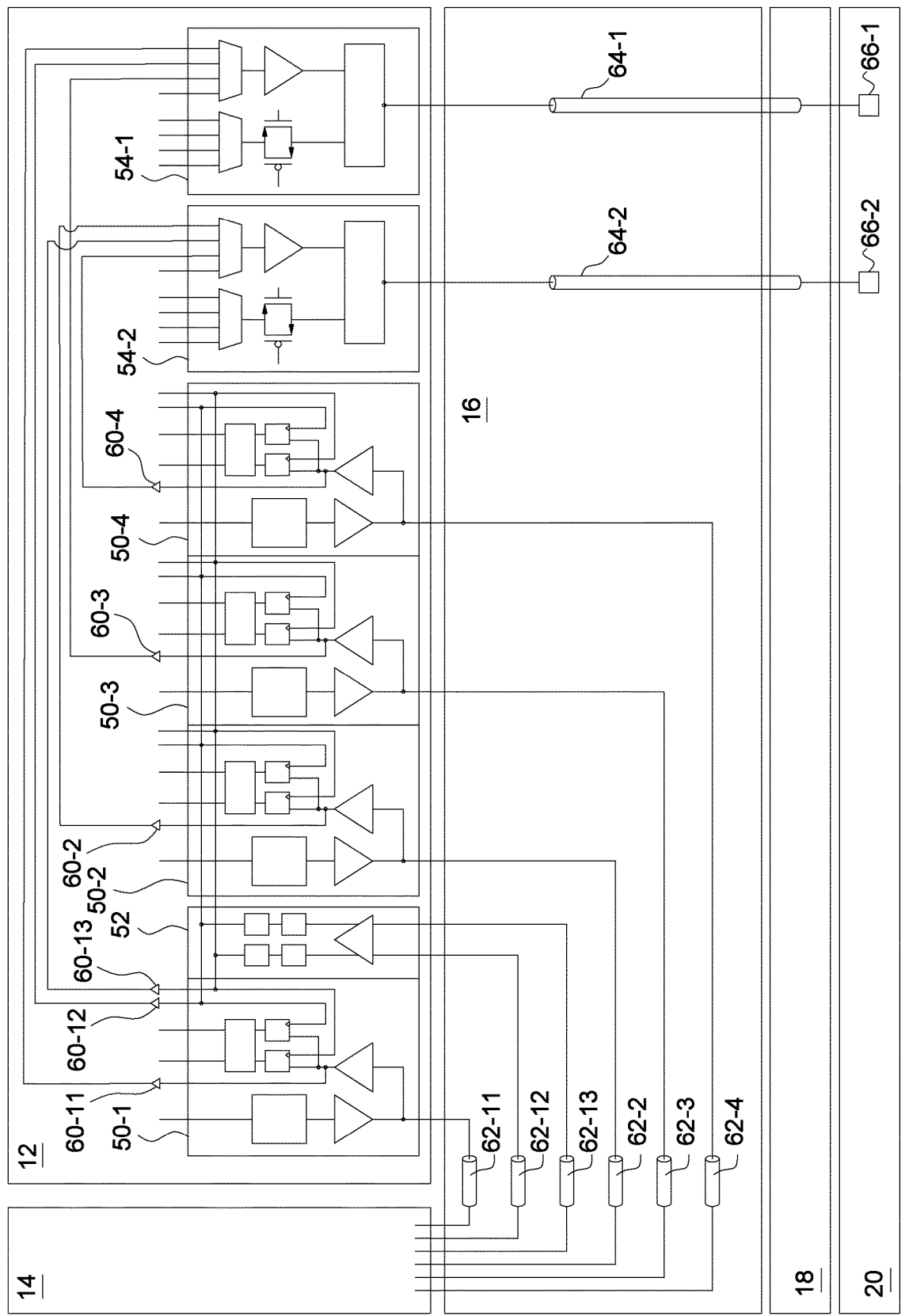
FIG. 2 is a circuit schematic of debug circuitry in an interposer-based design of an electronic device, in accordance with some examples of the present disclosure.

FIG. 2 is a circuit schematic of debug circuitry in an interposer-based design of an electronic device, in accordance with some examples. The interposer-based design can be as described above with respect to FIG. 1. In the example described below with respect to FIG. 2, the second integrated circuit die 14 implements HBM; although, other examples can implement any other synchronous memory technology.

The first integrated circuit die 12 includes a first input/output (IO) base cell 50-1, a second IO base cell 50-2, a third IO base cell 50-3, and a fourth IO base cell 50-4 (collectively or individually, "IO base cell 50"). The first integrated circuit die 12 also includes a receiver strobe cell 52 that is associated with the first IO base cell 50-1. The first integrated circuit die 12 further includes a first debug port 54-1 and a second debug port 54-2 (collectively or individually, "debug port 54"). The IO base cell 50, receiver strobe cell 52, and debug port 54 are described in greater detail with respect to FIGS. 3 and 4. Various nodes of the IO base cells 50 and receiver strobe cell 52 are communicatively coupled, via buffers 60-11, 60-12, 60-13, 60-2, 60-3, and 60-4 in the first integrated circuit die 12, with nodes of the first and second debug ports 54-1 and 54-2, as will be described in further detail subsequently.

FIG. 2 illustrates physical channels 62-11, 62-12, 62-13, 62-2, 62-3, and 62-4 that electrically couple nodes of the second integrated circuit die 14 with nodes of the first integrated circuit die 12 via the interposer 16. The physical channels 62-11, 62-12, 62-13, 62-2, 62-3, and 62-4 include conductive bumps 22 and one or more metal layers of one or more redistribution layers on the interposer 16. FIG. 2 further illustrates physical channels 64-1 and 64-2 that electrically couple nodes of the first integrated circuit die 12 with respective first and second debug pins 66-1 and 66-2 on the PCB 20, via the interposer 16 and package substrate 18. The physical channels 64-1 and 64-2 include conductive bumps 22, one or more metal layers and TSVs of the interposer 16, conductive bumps 24, one or more metal layers and/or vias of the package substrate 18, conductive balls 26, and one or more metal layers on the PCB 20.

Figure 3:
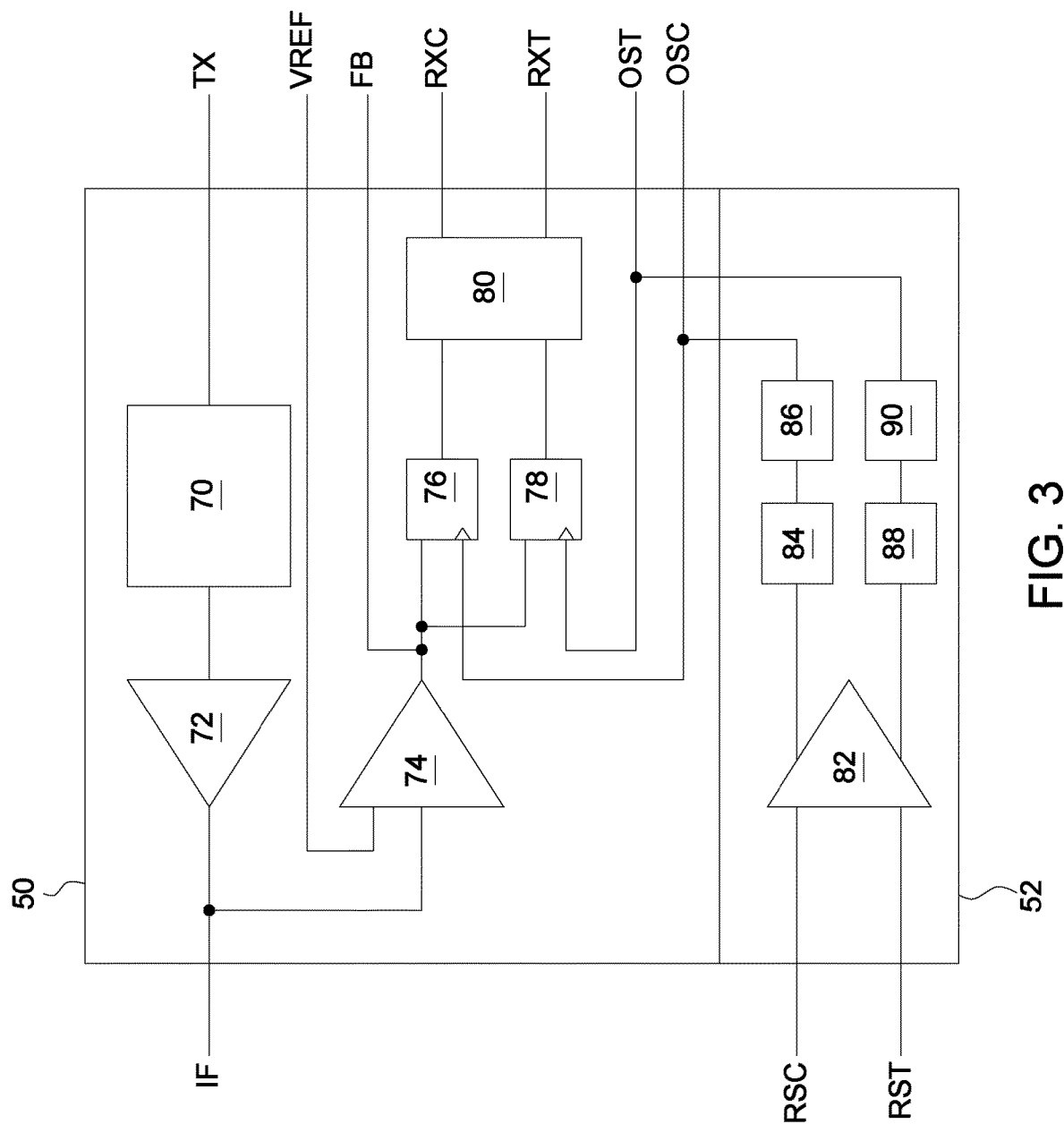
FIG. 3 is an input/output (IO) base cell and a receiver strobe cell of an integrated circuit of the electronic device of FIG. 2, in accordance with some examples of the present disclosure.

FIG. 3 illustrates an IO base cell 50 and a receiver strobe cell 52, in accordance with some examples. The IO base cell 50 includes a transmission data path 70, a transmission driver 72, a receiver 74, flip-flops 76 and 78, and a receiver data path 80. An input node of the transmission data path 70 is electrically connected to a transmission node TX of the first integrated circuit die 12. The transmission data path 70 can include flip-flops and/or logic for redundancy and for integrity of data to be transmitted. An output node of the transmission data path 70 is electrically connected to an input node of the transmission driver 72. The transmission driver 72, in some examples, is a tri-state binary driver that is configurable to selectively output a signal that is input to the transmission driver 72 or maintain a high output impedance. An output node of the transmission driver 72 is electrically connected to an interface node IF, which is further electrically connected to an input node of the receiver 74. The receiver 74, in some examples, is a reference voltage (VREF) based receiver that is configurable to selectively output a signal that is input to the receiver 74 or to be in an off state (and hence, not transmit a signal input to the receiver 74). The receiver 74 has an input node electrically connected to a reference voltage node VREF. An output node of the receiver 74 is electrically connected to a feedback node FB and to data input nodes of each of the flip-flops 76 and 78. Output nodes of the flip-flops 76 and 78 are electrically connected to respective input nodes of the receiver data path 80. The receiver data path 80 can include flip-flops or logic for redundancy, test logic for errors in data that is received, and/or scan chains. Output nodes of the receiver data path 80 are electrically connected to an even receive output node RXT and an odd receive output node RXC.

As will become apparent, the IO base cell 50 can be configured, based on the configuration of the transmission driver 72 and the receiver 74, to be output only, input only, bi-directional input/output, and/or input/output loopback. The configuration of the IO base cell 50 can be altered depending on an operation of the first integrated circuit die 12, such as for writing to memory, reading from memory, and/or debugging.

The receiver strobe cell 52 includes a differential receiver 82, delay lines 84 and 88, and buffers 86 and 90. Differential input nodes of the differential receiver 82 are electrically connected to true read strobe node RST and complementary read strobe node RSC. A first differential output node of the differential receiver 82 is electrically connected to the serially connected delay line 84 and buffer 86, and a second differential output node of the differential receiver 82 is electrically connected to the serially connected delay line 88 and buffer 90. An output node of the buffer 90 is electrically connected to a clock input node of the flip-flop 78 and to a true strobe observation node OST. An output node of the buffer 86 is electrically connected to a clock input node of the flip-flop 76 and to a complementary strobe observation node OSC.

Referring back to FIG. 2, the receiver strobe cell 52 is associated with the first IO base cell 50-1, second IO base cell 50-2, third IO base cell 50-3, and fourth IO base cell 50-4. The clock input nodes of the flip-flops 76 and 78 of the IO base cells 50-1, 50-2, 50-3, and 50-4 are electrically connected to the complementary strobe observation node OSC and true strobe observation node OST, respectively, of the receiver strobe cell 52. The pattern of IO base cells 50 and receiver strobe cell 52 can be repeated in the first integrated circuit die 12, and/or more or fewer IO base cells 50 may be implemented with a receiver strobe cell 52 associated with one of the IO base cells 50 (e.g., one receiver strobe cell 52 can be associated with one IO base cell 50 of a group of thirty-two IO base cells 50).

The interface node IF of the first IO base cell 50-1 is electrically connected to the physical channel 62-11. The interface node IF of the first IO base cell 50-1 is configured to transmit during a write operation to and receive during a read operation from the second integrated circuit die 14 a first data signal DQ0. The complementary read strobe node RSC of the receiver strobe cell 52 is electrically connected to the physical channel 62-12. The complementary read strobe node RSC of the receiver strobe cell 52 is configured to receive a complementary read data strobe signal RDQSC from the second integrated circuit die 14. The true read strobe node RST of the receiver strobe cell 52 is electrically connected to the physical channel 62-13. The true read strobe node RST of the receiver strobe cell 52 is configured to receive a true read data strobe signal RDQST from the second integrated circuit die 14. The first integrated circuit die 12 can be configured to distribute the true read data strobe signal RDQST and the complementary read data strobe signal RDQSC in a matched clock tree distribution to all data bits (e.g., all IO base cells 50 for receiving a data signal).

The interface node IF of the second IO base cell 50-2 is electrically connected to the physical channel 62-2. The interface node IF of the second IO base cell 50-2 is configured to transmit during a write operation to and receive during a read operation from the second integrated circuit die 14 a second data signal DQ1. The interface node IF of the third IO base cell 50-3 is electrically connected to the physical channel 62-3. The interface node IF of the third IO base cell 50-3 is configured to transmit during a write operation to the second integrated circuit die 14 a true write data strobe signal WDQST. The interface node IF of the fourth IO base cell 50-4 is electrically connected to the physical channel 62-4. The interface node IF of the fourth IO base cell 50-4 is configured to transmit during a write operation to the second integrated circuit die 14 a complementary write data strobe signal WDQSC.

Figure 4:
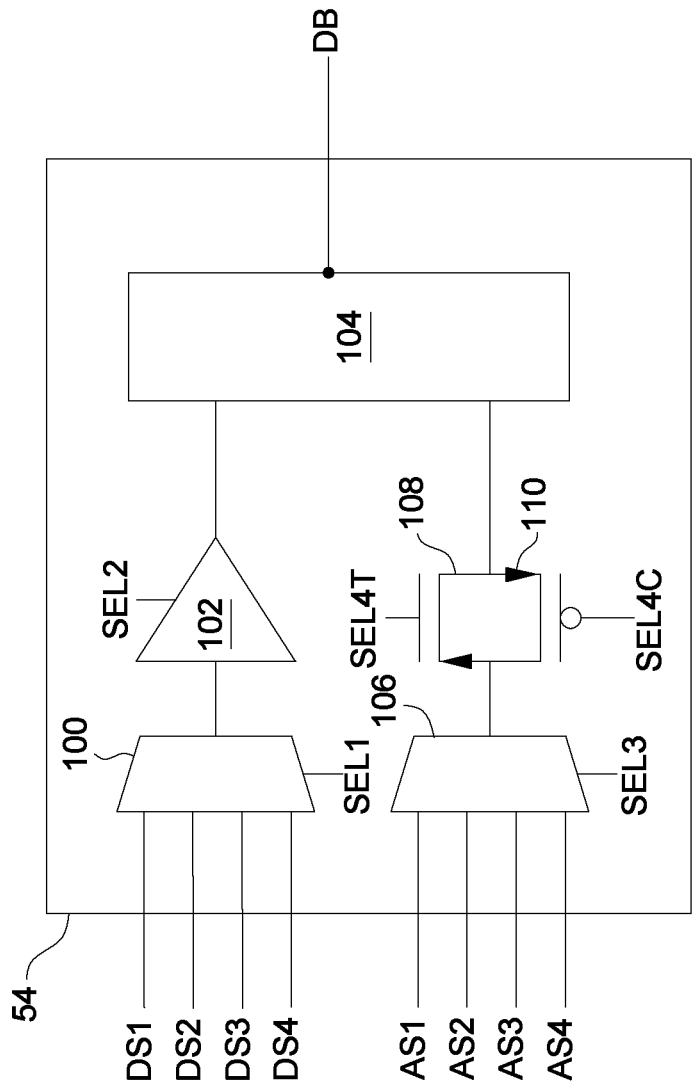
FIG. 4 is a debug port of an integrated circuit of the electronic device of FIG. 2, in accordance with some examples of the present disclosure.

FIG. 4 illustrates a debug port 54, in accordance with some examples. The debug port 54 includes a first multiplexer 100, a transmission driver 102, an electric static discharge (ESD) circuit 104, a second multiplexer 106, and a transmission gate (including an n-type transistor 108 and a p-type transistor 110).

The first multiplexer 100 includes four input nodes—a first digital signal input node DS1, a second digital signal input node DS2, a third digital signal input node DS3, and a fourth digital signal input node DS4. The first multiplexer 100 has a select signal node SEL1. An output node of the first multiplexer 100 is electrically connected to the transmission driver 102. The transmission driver 102, in the illustrated example, is a tri-state binary driver that is configurable to selectively output a signal that is input to the transmission driver 102 or maintain a high output impedance based on a select signal input on a select signal node SEL2 of the transmission driver 102. An output node of the transmission driver 102 is electrically connected to the ESD circuit 104, and an output of the ESD circuit is connected to a debug node DB.

The second multiplexer 106 includes four input nodes—a first analog signal input node AS1, a second analog signal input node AS2, a third analog signal input node AS3, and a fourth analog signal input node AS4. The second multiplexer 106 has a select signal node SEL3. An output node of the second multiplexer 106 is electrically connected to the transmission gate. The n-type transistor 108 is connected in parallel with the p-type transistor 110 (e.g., source/drains are connected together in parallel). The output node of the second multiplexer 106 is electrically connected to source/drains of the n-type transistor 108 and the p-type transistor 110, and other source/drains of the n-type transistor 108 and the p-type transistor 110 are electrically connected to the ESD circuit 104. A true select signal node SEL4T is electrically connected to the gate of the n-type transistor 108, and a complementary select signal node SEL4C is electrically connected to the gate of the p-type transistor 110.

The signals input to the various select signal nodes of the first and second debug ports 54-1 and 54-2 can be respective bits of multi-bit signals. For example, the select signal nodes SEL1 of the first and second debug ports 54-1 and 54-2 can each provide two respective bits of a four bit select signal to the first multiplexers 100 of the first and second debug ports 54-1 and 54-2. Similarly, the select signal nodes SEL2 of the first and second debug ports 54-1 and 54-2 can each provide a respective bit of a two bit select signal to the transmission drivers 102 of the first and second debug ports 54-1 and 54-2. Further, the true select signal nodes SEL4T of the first and second debug ports 54-1 and 54-2 can each provide a respective bit of a two bit select signal to the transmission gates of the first and second debug ports 54-1 and 54-2, and the complementary select signal nodes SEL4C of the first and second debug ports 54-1 and 54-2 can each provide a respective bit of a two bit select signal to the transmission gates of the first and second debug ports 54-1 and 54-2. The signals on nodes that are indicated as "true" and "complementary" are complementary signals. The logic implemented for various components can permit logical high (e.g., logic "1") values or logical low (e.g., logic "0") to assert select signals to selectively configure the various components.

In some examples, digital signals are to be routed to the first multiplexer 100, and analog signals are to be routed to the second multiplexer 106. By separating the signals between the first multiplexer 100 and second multiplexer 106, potential coupling between noisy digital signals and sensitive analog direct current (DC) signals may be reduced.

Referring to FIG. 2, the feedback node FB of the first IO base cell 50-1 is electrically connected to an input node of the buffer 60-11, and an output node of the buffer 60-11 is electrically connected to the first digital signal input node DS1 of the first debug port 54-1. The true strobe observation node OST of the receiver strobe cell 52 is electrically connected to an input node of the buffer 60-12, and an output node of the buffer 60-12 is electrically connected to the second digital signal input node DS2 of the first debug port 54-1. The complementary strobe observation node OSC of the receiver strobe cell 52 is electrically connected to an input node of the buffer 60-13, and an output node of the buffer 60-13 is electrically connected to the second digital signal input node DS2 of the second debug port 54-2. The feedback node FB of the second IO base cell 50-2 is electrically connected to an input node of the buffer 60-2, and an output node of the buffer 60-2 is electrically connected to the first digital signal input node DS1 of the second debug port 54-2. The feedback node FB of the third IO base cell 50-3 is electrically connected to an input node of the buffer 60-3, and an output node of the buffer 60-3 is electrically connected to the third digital signal input node DS3 of the first debug port 54-1. The feedback node FB of the fourth IO base cell 50-4 is electrically connected to an input node of the buffer 60-4, and an output node of the buffer 60-4 is electrically connected to the third digital signal input node DS3 of the second debug port 54-2.

The metal routing from the feedback nodes FB of the first, second, third, and fourth IO base cells 50-1, 50-2, 50-3, and 50-4 and the true strobe observation node OST and complementary strobe observation node OSC of the receiver strobe cell 52 to the first through third digital signal input nodes DS1 through DS3 of the first and second debug ports 54-1 and 54-2 can be matched to minimize timing skew of signals transmitted between the nodes.

The debug node DB of the first debug port 54-1 is electrically connected to the physical channel 64-1, which is further electrically connected to the first debug pin 66-1 on the PCB 20. The debug node DB of the second debug port 54-2 is electrically connected to the physical channel 64-2, which is further electrically connected to the second debug pin 66-2 on the PCB 20.

Although not specifically illustrated, the fourth digital signal input nodes DS4 and the analog signal input nodes AS1 through AS4 of the first and second debug ports 54-1 and 54-2 can be electrically connected to various nodes to provide signals to the first and second debug ports 54-1 and 54-2 for debugging. In some examples, the fourth digital signal input node DS4 of the first debug port 54-1 is electrically connected to a phase-locked loop (PLL) clock node PLL CLK for providing a clock signal, and the fourth digital signal input node DS4 of the second debug port 54-2 is electrically connected to a phase interpolator (PI) clock node PI CLK for providing a clock signal. The analog signal input nodes AS1 through AS4 of the first debug port 54-1 can be electrically coupled to a receiver reference voltage node VREF, a R-2R signal node R2R, a digitally controlled impedance reference voltage node DCI_REF, and a pull-down calibration signal node DCI_CAL_PAD_DUMMY, respectively. The analog signal input nodes AS1 through AS4 of the second debug port 54-2 can be electrically coupled to a p-current source bias signal node PBIAS, an n-current source bias signal node N BIAS, a pull-up calibration signal node DCI_CAL_PAD, and a digitally controlled impedance reference voltage node DCI_REF, respectively. These analog signal nodes may be internal to the first integrated circuit die 12 and may provide respective DC signals. A person having ordinary skill in the art will readily understand the signals that would be provided on these nodes.

During regular operations, the transmission drivers 72 of the IO base cells 50 are configured to selectively transmit signals or have a high output state, and the receivers 74 of the IO base cells 50 are configured to selectively receive signals or be in an off state. In a write operation, the transmission drivers 72 are configured to selectively transmit signals received at transmission nodes TX of the transmission drivers 72, e.g., by asserting a select signal to set a state of the tri-state binary driver. The receivers 74 are configured to be in an off state, e.g., by de-asserting a select signal to set a state of the respective receiver 74. Data signals DQ0 and DQ1 received at transmission nodes TX of the transmission data paths 70 of the first IO base cell 50-1 and second IO base cell 50-2 are transmitted through the transmission data paths 70 and transmission drivers 72 to the physical channels 62-11 and 62-2, respectively, to be written to memory in the second integrated circuit die 14. Similarly, a true write data strobe signal WDQST and a complementary write data strobe signal WDQSC received at transmission nodes TX of the transmission data paths 70 of the third IO base cell 50-3 and fourth IO base cell 50-4 are transmitted through the transmission data paths 70 and transmission drivers 72 to the physical channels 62-3 and 62-4, respectively, to be used for writing to memory in the second integrated circuit die 14.

In a read operation, the receiver 74 of the first IO base cell 50-1 and second IO base cell 50-2 are configured to selectively receive signals at interface nodes IF of the receivers 74, e.g., by asserting a select signal to set a state of the respective receiver 74. The receivers 74 of the third IO base cell 50-3 and fourth IO base cell 50-4 are configured to be in an off state, e.g., by de-asserting a select signal to set a state of the respective receiver 74, and the transmission drivers 72 are configured to be in a high impedance output state, e.g., by de-asserting a select signal to set a state of the tri-state binary driver. Data signals DQ0 and DQ1 received at interface nodes IF of receivers 74 of the first IO base cell 50-1 and second IO base cell 50-2, via the physical channels 62-11 and 62-2, respectively, are transmitted through the receivers 74, flip-flops 76 and 78, and the receiver data paths 80 to be provided at the odd receive output node RXC and even receive output node RXT nodes for circuitry in the first integrated circuit die 12.

During regular operations (e.g., non-debug operations), the transmission drivers 102 and transmission gates (including the transistors 108 and 110) of the first debug port 54-1 and the second debug port 54-2 are configured to be in a high impedance output state, e.g., by de-asserting select signals on select signal nodes SEL2, SEL4T, and SEL4C. With the output states configured to be a high impedance, no signals are transmitted through the ESD circuit 104 to the debug node DB of the first debug port 54-1 and the second debug port 54-2.

During debug operations, various signals can be fed back to the first debug port 54-1 and the second debug port 54-2 and selectively output at the first debug pin 66-1 and second debug pin 66-2. In a debug write operation, the transmission drivers 72 are configured to selectively transmit signals received at input nodes of the transmission drivers 72, e.g., by asserting a select signal to set a state of the tri-state binary driver, and receivers 74 are configured to selectively receive signals at input nodes of the receivers 74, e.g., by asserting a select signal to set a state of the respective receiver 74. Data signals DQ0 and DQ1 received at transmission nodes TX of the transmission data paths 70 of the first IO base cell 50-1 and second IO base cell 50-2 are transmitted through the transmission data paths 70 and transmission drivers 72 to the physical channels 62-11 and 62-2, respectively, to be written to memory in the second integrated circuit die 14. Further, the data signals DQ0 and DQ1 are received at input nodes of the receivers 74 of the first IO base cell 50-1 and second IO base cell 50-2 and output through the receivers 74 and buffers 60-11 and 60-2 to the first digital signal input nodes DS1 of the first debug port 54-1 and the second debug port 54-2, respectively. Similarly, a true write data strobe signal WDQST and a complementary write data strobe signal WDQSC received at transmission nodes TX of the transmission data paths 70 of the third IO base cell 50-3 and fourth IO base cell 50-4 are transmitted through the transmission data paths 70 and transmission drivers 72 to the physical channels 62-3 and 62-4, respectively, to be used for writing to memory in the second integrated circuit die 14. Further, the true write data strobe signal WDQST and complementary write data strobe signal WDQSC are received at input nodes of the receivers 74 of the third IO base cell 50-3 and fourth IO base cell 50-4 and output through the receivers 74 and buffers 60-3 and 60-4 to the third digital signal input nodes DS3 of the first debug port 54-1 and the second debug port 54-2, respectively.

In a debug read operation, the receivers 74 of the first IO base cell 50-1 and second IO base cell 50-2 are configured to selectively receive signals received at input nodes of the receivers 74, e.g., by asserting a select signal to set a state of the respective receiver 74. The receivers 74 of the third IO base cell 50-3 and fourth IO base cell 50-4 are configured to be in an off state, e.g., by de-asserting a select signal to set a state of the respective receiver 74, and the transmission drivers 72 are configured to be in a high impedance output state, e.g., by de-asserting a select signal to set a state of the tri-state binary driver. Data signals DQ0 and DQ1 received at interface nodes IF of receivers 74 of the first IO base cell 50-1 and second IO base cell 50-2, via the physical channels 62-11 and 62-2, respectively, are transmitted through the receivers 74 and buffers 60-11 and 60-2 to the first digital signal input nodes DS1 of the first debug port 54-1 and the second debug port 54-2, respectively. A true read data strobe signal RDQST and a complementary read data strobe signal RDQSC received at the true read strobe node RST and complementary read strobe node RSC of the differential receiver 82 of the receiver strobe cell 52, via the physical channels 62-13 and 62-12, respectively, are transmitted through the differential receiver 82, delay lines 88 and 84, buffers 90 and 86, and buffers 60-12 and 60-13 to the second digital signal input nodes DS2 of the first debug port 54-1 and the second debug port 54-2, respectively.

During debug operations, various select signals of the first debug port 54-1 and second debug port 54-2 can be asserted or de-asserted to selectively pass signals received at the digital signal input nodes DS1 through DS4 and analog signal input nodes AS1 through AS4 to the debug node DB, and hence, through the physical channels 64-1 and 64-2 to the debug pins 66-1 and 66-2. For each of the first debug port 54-1 and second debug port 54-2, if a signal at one of the digital signal input nodes DS1 through DS4 is to be output on the debug node DB (and hence, the corresponding debug pin 66), the select signal at the second select signal node SEL2 is asserted to set the state of the transmission driver 102 to transmit a signal to the output node of the transmission driver 102 that is received at the input node of the transmission driver 102, while the select signals at the true select signal node SEL4T and complementary select signal node SEL4C are de-asserted to not pass a signal through the transmission gate. For each of the first debug port 54-1 and second debug port 54-2, if a signal at one of the analog signal input nodes AS1 through AS4 is to be output on the debug node DB (and hence, the corresponding debug pin 66), the select signals at the true select signal node SEL4T and complementary select signal node SEL4C are asserted to pass a signal through the transmission gate, while the select signal at the second select signal node SEL2 is de-asserted to set the state of the transmission driver 102 to have a high output impedance and not pass a signal through the transmission driver 102.

Further, for each of the first debug port 54-1 and second debug port 54-2, if a signal at one of the digital signal input nodes DS1 through DS4 is to be output on the debug node DB, the select signal at the select signal node SEL1 is asserted to selectively output to an output node of the first multiplexer 100 (and hence, to the transmission driver 102) a signal on a corresponding one of the digital signal input nodes DS1 through DS4. Also, for each of the first debug port 54-1 and second debug port 54-2, if a signal at one of the analog signal input nodes AS1 through AS4 is to be output on the debug node DB, the select signal at the select signal node SEL3 is asserted to selectively output to an output node of the second multiplexer 106 (and hence, to the transmission gate) a signal on a corresponding one of the analog signal input nodes AS1 through AS4.

Various permutations and combinations of signals can be output at the first debug pin 66-1 and second debug pin 66-2, as a person having ordinary skill in the art will readily understand based on the foregoing description. Some example combinations are described below. With signals being output at the debug pins 66-1 and 66-2, the debug pins 66-1 and 66-2 can be probed and the signals at the debug pins 66-1 and 66-2 can be observed using an oscilloscope or voltmeter. The signals, and timing relationship therebetween, viewed using the oscilloscope can be used to debug the first integrated circuit die 12 and/or the second integrated circuit die 14.

In a first example, in a debug write operation, a first data signal DQ0 and a complementary write data strobe signal WDQSC are output to the debug pins 66-1 and 66-2. As described previously, the first data signal DQ0 is fed back through the receiver 74 of the first IO base cell 50-1 and the buffer 60-11 to the first digital signal input node DS1 of the first debug port 54-1. The first multiplexer 100 of the first debug port 54-1 selectively passes the first data signal DQ0 at the first digital signal input node DS1 to the transmission driver 102 based on the select signal at the select signal node SEL1. The transmission driver 102 passes the first data signal DQ0, based on the select signal at the select signal node SEL2, and the first data signal DQ0 passes through the ESD circuit 104 to the debug node DB of the of the first debug port 54-1, and hence, through the physical channel 64-1 to the first debug pin 66-1. Also as described previously, the complementary write data strobe signal WDQSC is fed back through the receiver 74 of the fourth IO base cell 50-4 and the buffer 60-4 to the third digital signal input node DS3 of the second debug port 54-2. The first multiplexer 100 of the second debug port 54-2 selectively passes the complementary write data strobe signal WDQSC at the third digital signal input node DS3 to the transmission driver 102 based on the select signal at the select signal node SEL1. The transmission driver 102 passes the complementary write data strobe signal WDQSC, based on the select signal at the select signal node SEL2, and the complementary write data strobe signal WDQSC passes through the ESD circuit 104 to the debug node DB of the of the second debug port 54-2, and hence, through the physical channel 64-2 to the second debug pin 66-2.

Figure 5:
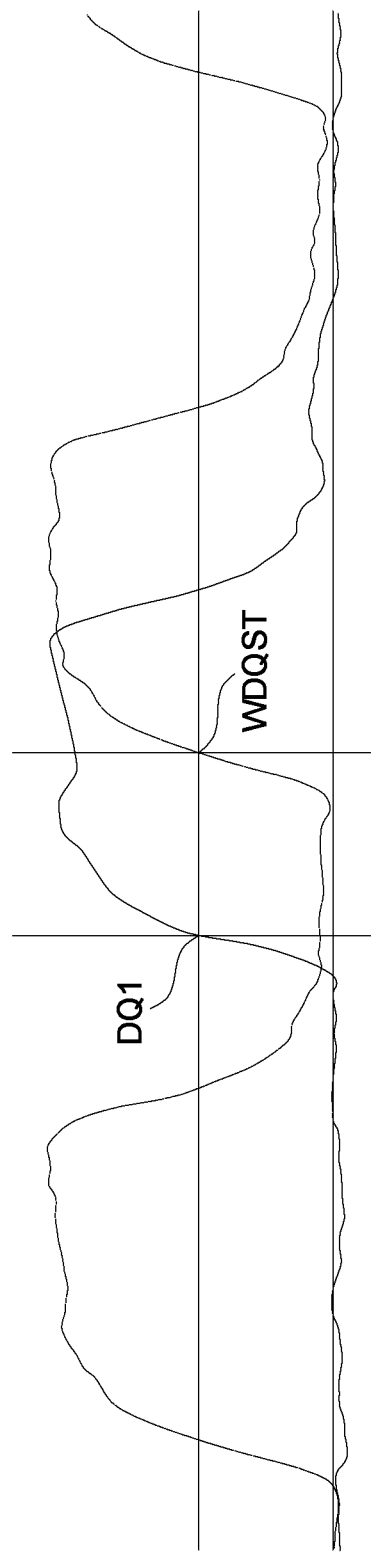
FIG. 5 is an example oscilloscope output of the true write data strobe signal and second data signal, in accordance with some examples of the present disclosure.

In a second example, in a debug write operation, a true write data strobe signal WDQST and a second data signal DQ1 are output to the debug pins 66-1 and 66-2. As described previously, the true write data strobe signal WDQST is fed back through the receiver 74 of the third IO base cell 50-3 and the buffer 60-3 to the third digital signal input node DS3 of the first debug port 54-1. The first multiplexer 100 of the first debug port 54-1 selectively passes the true write data strobe signal WDQST at the third digital signal input node DS3 to the transmission driver 102 based on the select signal at the select signal node SEL1. The transmission driver 102 passes the true write data strobe signal WDQST, based on the select signal at the select signal node SEL2, and the true write data strobe signal WDQST passes through the ESD circuit 104 to the debug node DB of the of the first debug port 54-1, and hence, through the physical channel 64-1 to the first debug pin 66-1. Also as described previously, the second data signal DQ1 is fed back through the receiver 74 of the second IO base cell 50-2 and the buffer 60-2 to the first digital signal input node DS1 of the second debug port 54-2. The first multiplexer 100 of the second debug port 54-2 selectively passes the second data signal DQ1 at the first digital signal input node DS1 to the transmission driver 102 based on the select signal at the select signal node SEL1. The transmission driver 102 passes the second data signal DQ1, based on the select signal at the select signal node SEL2, and the second data signal DQ1 passes through the ESD circuit 104 to the debug node DB of the of the second debug port 54-2, and hence, through the physical channel 64-2 to the second debug pin 66-2. FIG. 5 illustrates an example oscilloscope output of the true write data strobe signal WDQST and second data signal DQ1, in accordance with some examples.

In a third example, in a debug write operation, a true write data strobe signal WDQST and a complementary write data strobe signal WDQSC are output to the debug pins 66-1 and 66-2. The true write data strobe signal WDQST is output to the first debug pin 66-1 as describe previously in the second example. The complementary write data strobe signal WDQSC is output to the second debug pin 66-2 as describe previously in the first example.

In a fourth example, in a debug read operation, a first data signal DQ0 and a complementary read data strobe signal RDQSC are output to the debug pins 66-1 and 66-2. As described previously in the first example, the first data signal DQ0 is output to the first debug pin 66-1. Also as described previously, the complementary read data strobe signal RDQSC is provided at the complementary read strobe node RSC of the differential receiver 82 of the receiver strobe cell 52 and is passed through the delay line 84, the buffer 86, and the buffer 60-13 to the second digital signal input node DS2 of the second debug port 54-2. The first multiplexer 100 of the second debug port 54-2 selectively passes the complementary read data strobe signal RDQSC at the second digital signal input node DS2 to the transmission driver 102 based on the select signal at the select signal node SEL1. The transmission driver 102 passes the complementary read data strobe signal RDQSC, based on the select signal at the select signal node SEL2, and the complementary read data strobe signal RDQSC passes through the ESD circuit 104 to the debug node DB of the of the second debug port 54-2, and hence, through the physical channel 64-2 to the second debug pin 66-2.

In a fifth example, in a debug read operation, a true read data strobe signal RDQST and a second data signal DQ1 are output to the debug pins 66-1 and 66-2. As described previously, the true read data strobe signal RDQST is provided at the true read strobe node RST of the differential receiver 82 of the receiver strobe cell 52 and is passed through the delay line 88, the buffer 90, and the buffer 60-12 to the second digital signal input node DS2 of the first debug port 54-1. The first multiplexer 100 of the first debug port 54-1 selectively passes the true read data strobe signal RDQST at the second digital signal input node DS2 to the transmission driver 102 based on the select signal at the select signal node SEL1. The transmission driver 102 passes the true read data strobe signal RDQST, based on the select signal at the select signal node SEL2, and the true read data strobe signal RDQST passes through the ESD circuit 104 to the debug node DB of the of the first debug port 54-1, and hence, through the physical channel 64-1 to the first debug pin 66-1. As described previously in the second example, the second data signal DQ1 is output to the second debug pin 66-2.

In a sixth example, in a debug read operation, a true read data strobe signal RDQST and a complementary read data strobe signal RDQSC are output to the debug pins 66-1 and 66-2. The true read data strobe signal RDQST is output to the first debug pin 66-1 as describe previously in the fifth example. The complementary read data strobe signal RDQSC is output to the second debug pin 66-2 as describe previously in the fourth example.

In other examples, clock signals are output to the debug pins 66-1 and 66-2. As stated previously, clock signals are provided to the fourth digital signal input nodes DS4 of the first and second debug ports 54-1 and 54-2. The first multiplexers 100 selectively pass the clock signals at the fourth digital signal input nodes DS4 to the transmission drivers 102 based on the select signals at the select signal nodes SEL1. The transmission drivers 102 pass the clock signals, based on the select signals at the select signal nodes SEL2, and the clock signals pass through the ESD circuits 104 to the debug nodes DB of the of the first and second debug ports 54-1 and 54-2, and hence, through the physical channels 64-1 and 64-2 to the first and second debug pins 66-1 and 66-2, respectively. By outputting the clock signals, PLL clock jitter performance can be characterized.

In further examples, analog signals are output to the debug pins 66-1 and 66-2. As previously stated, various analog signals, such as reference voltage, bias voltages, digitally controlled impedance reference voltage, etc., are provided to the analog signal input nodes AS1 through AS4 of the first and second debug ports 54-1 and 54-2. The second multiplexers 106 selectively pass respective ones of the analog signals at the analog signal input nodes AS1 through AS4 to the transmission gates (e.g., transistors 108 and 110) based on the select signals at the select signal nodes SEL3. The transmission gates pass the selected analog signals, based on the select signals at the select signal nodes SEL4T and SEL4C, and the selected analog signals pass through the ESD circuits 104 to the debug nodes DB of the of the first and second debug ports 54-1 and 54-2, and hence, through the physical channels 64-1 and 64-2 to the first and second debug pins 66-1 and 66-2, respectively. The analog signals can be measured by probing the debug pins 66-1 and 66-2 with a voltmeter, for example. By outputting various analog signals, circuits internal to the first integrated circuit die 12 can be tested to determine whether those circuits are operating properly. For example, biasing circuitry, reference voltage generators, etc. can be tested to determine that those circuits are working as expected.

Figure 6:
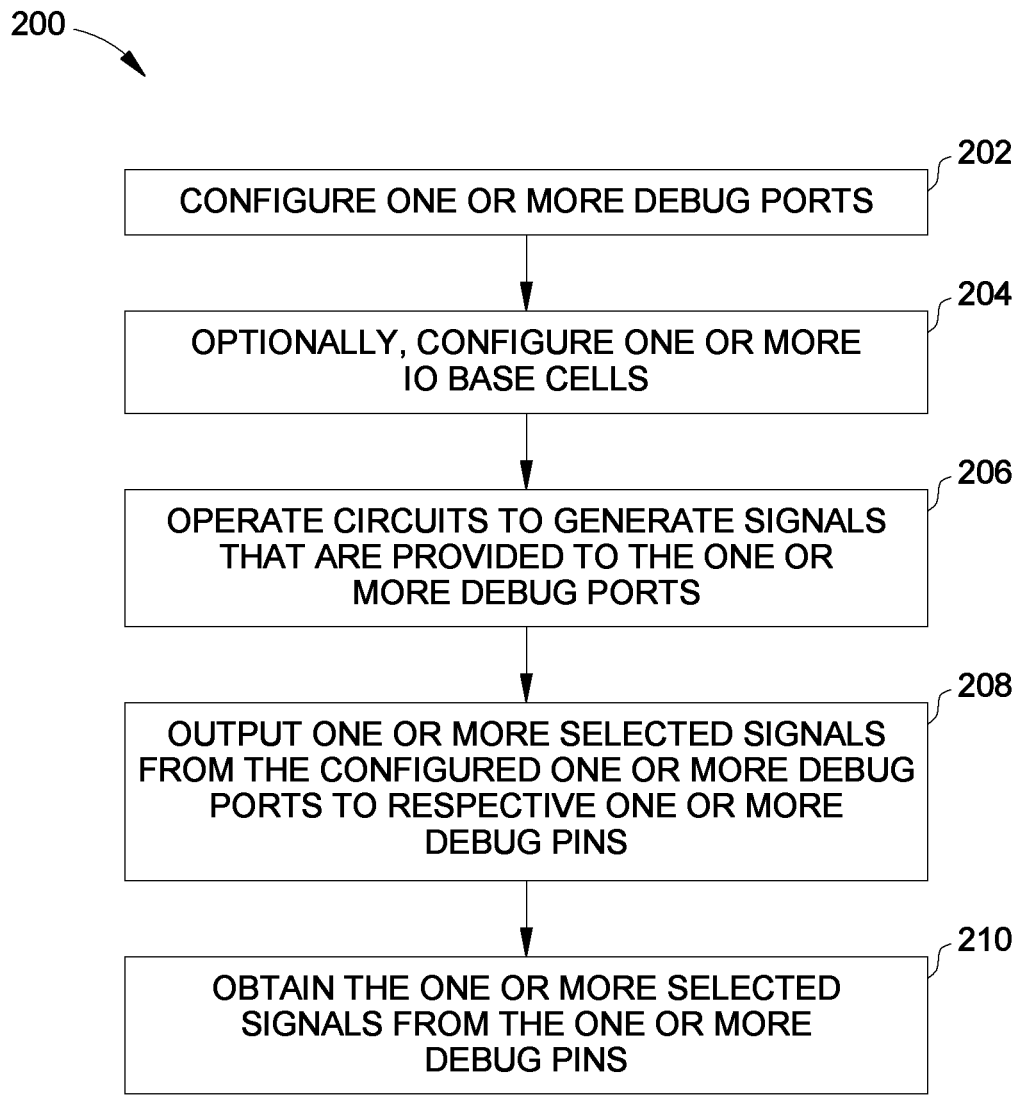
FIG. 6 is a flowchart of a method for debugging an electronic device, in accordance with some examples of the present disclosure.

FIG. 6 is a flowchart of a method 200 for debugging an electronic device, in accordance with some examples. In operation 202, one or more debug ports are configured to selectively output a signal to a respective debug pin. For example, various multiplexers, transmission drivers, and transmission gates are configured to selectively output a signal from a debug port. In operation 204, for a debug write and/or read operation, one or more IO base cells are configured to selectively output and provide respective signals to the one or more debug ports. For example, various transmission drivers and/or receivers of the IO base cells are configured to be in various states to selectively output and provide the signals. In operation 206, various circuits are operated to generate the signals that are provided to the one or more debug ports. For example, debug read and/or write operations to memory are performed via the one or more IO base cells, and/or circuits that generate analog signals are operated. In operation 208, one or more selected signals are output from the configured one or more debug ports to the respective one or more debug pins. In operation 210, the one or more selected signals are obtained at the one or more debug pins, such as by probing with an oscilloscope, voltmeter, or the like. The signals can be obtained contemporaneously with the operation of the circuits. The obtained signals can be a basis for debugging.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A device comprising:
    a first integrated circuit die comprising:
        a first input/output (IO) base cell having a first interface node and a first feedback node, the first interface node being configured to be coupled to memory for communication between the first IO base cell and the memory, the first IO base cell being configurable to selectively output to the first feedback node a signal that is on the first interface node; and a first debug port having a first input node and a first output node, the first input node being electrically connected to the first feedback node, the first debug port being configurable to selectively output to the first output node a signal that is on the first input node, the first output node being configured to be coupled to a first pin exterior to the first integrated circuit die.

2. The device of claim 1, wherein the first integrated circuit die further comprises a receiver strobe cell having a strobe node and an observation node, the strobe node being configured to be coupled to the memory for communication between the receiver strobe cell and the memory, the observation node being electrically connected to a second input node of the first debug port, the first debug port being configurable to selectively output to the first output node a signal that is on the first input node or the second input node.

3. The device of claim 1 further comprising:
a second integrated circuit die comprising the memory;
an interposer, the first integrated circuit die and the second integrated circuit die each being mechanically attached and electrically coupled to the interposer, the first interface node being coupled to the memory for communication between the first IO base cell and the memory via the interposer;
a package substrate, the interposer being mechanically attached and electrically coupled to the package substrate; and
a printed circuit board, the package substrate being mechanically attached and electrically coupled to the printed circuit board, the first pin being on the printed circuit board.

4. The device of claim 1, wherein the first IO base cell includes a transmission driver and a receiver, the transmission driver being a tri-state binary driver, the receiver being configurable to selectively receive a signal or be in an off state, an output node of the transmission driver being electrically connected to the first interface node, an input node of the receiver being electrically connected to the first interface node, an output node of the receiver being electrically connected to the first feedback node.

5. The device of claim 1, wherein the first debug port includes a digital multiplexer and a transmission driver, the digital multiplexer having multiple digital input nodes, the first input node of the first debug port being one of the multiple digital input nodes, the transmission driver being a tri-state binary driver, an output node of the digital multiplexer being electrically connected to an input node of the transmission driver, an output node of the transmission driver being coupled to the first output node of the first debug port.

6. The device of claim 5, wherein the first debug port further includes an analog multiplexer and a transmission gate, the analog multiplexer having multiple analog input nodes, an output node of the analog multiplexer being electrically connected to an input node of the transmission gate, an output node of the transmission gate being coupled to the first output node of the first debug port.

7. The device of claim 1, wherein the first feedback node is electrically connected to an input node of a buffer, and an output node of the buffer is electrically connected to the first input node of the first debug port.

8. The device of claim 1, wherein the first integrated circuit die further comprises:
a receiver strobe cell having a true strobe node, a complementary strobe node, a true observation node, and a complementary observation node, the true strobe node and the complementary strobe node being configured to be coupled to the memory for communication between the receiver strobe cell and the memory;
a second IO base cell having a second interface node and a second feedback node, the second interface node being configured to be coupled to the memory for communication between the second IO base cell and the memory, the second IO base cell being configurable to selectively output to the second feedback node a signal that is on the second interface node;
a third IO base cell having a third interface node and a third feedback node, the third interface node being configured to be coupled to the memory for communication between the third IO base cell and the memory, the third IO base cell being configurable to selectively output to the third feedback node a signal that is on the third interface node;
a fourth IO base cell having a fourth interface node and a fourth feedback node, the fourth interface node being configured to be coupled to the memory for communication between the fourth IO base cell and the memory, the fourth IO base cell being configurable to selectively output to the fourth feedback node a signal that is on the fourth interface node; and
a second debug port having a second output node, the second output node being configured to be coupled to a second pin exterior to the first integrated circuit die; and
wherein:
the first debug port further has a second input node and a third input node;
the second debug port has a fourth input node, a fifth input node, and a sixth input node;
the second input node is electrically connected to the true observation node;
the third input node is electrically connected to the third feedback node;
the fourth input node is electrically connected to the second feedback node;
the fifth input node is electrically connected to the complementary observation node;
the sixth input node is electrically connected to the fourth feedback node;
the first debug port is configurable to selectively output to the first output node a signal that is on one of the first input node, the second input node, and the third input node; and
the second debug port is configurable to selectively output to the second output node a signal that is on one of the fourth input node, the fifth input node, and the sixth input node.

9. The device of claim 8, wherein the first interface node is a first data node, the second interface node is a second data node, the third interface node is a true write data strobe node, and the fourth interface node is a complementary write data strobe node.

10. The device of claim 9, wherein:
the first debug port further has a seventh input node;
the second debug port has an eighth input node;
the seventh input node is electrically connected to a phase-locked loop clock node; and
the eighth input node is electrically connected to a phase interpolator clock node.

11. A method of debugging, the method comprising:
configuring a first debug port on a first integrated circuit die to selectively output a first selected signal provided to one of first multiple input nodes of the first debug port;
configuring a first input/output (IO) base cell on the first integrated circuit die to provide a first feedback signal to one of the first multiple input nodes of the first debug port;
performing an operation on the first integrated circuit die and a second integrated circuit die, wherein the operation includes a write operation to memory on the second integrated circuit die through the first IO base cell, a read operation to the memory through the first IO base cell, or a combination thereof, wherein during performing the operation, the first feedback signal is provided to the one of the first multiple input nodes of the first debug port; and
outputting to a first output node of the first debug port the first selected signal based on the configuration of the first debug port.

12. The method of claim 11, wherein the first integrated circuit die and the second integrated circuit die are mechanically attached and electrically coupled to an interposer, the first integrated circuit die being communicatively coupled to the second integrated circuit die via the interposer.

13. The method of claim 12 further comprising obtaining the first selected signal from a pin on a printed circuit board, wherein the interposer is mechanically attached and electrically coupled to the printed circuit board.

14. The method of claim 11 further comprising:
configuring a second debug port on the first integrated circuit die to selectively output a second selected signal provided to one of second multiple input nodes of the second debug port; and
outputting to a second output node of the second debug port the second selected signal based on the configuration of the second debug port; and
wherein:
the operation includes the read operation; and
during the read operation:
a data signal is communicated from the memory to the first IO base cell, the data signal being the first feedback signal; and
a read data strobe signal is communicated from the memory to a receiver strobe cell, the read data strobe signal being provided to one of the second multiple input nodes of the second debug port.

15. The method of claim 11 further comprising:
configuring a second debug port on the first integrated circuit die to selectively output a second selected signal provided to one of second multiple input nodes of the second debug port;
configuring a second IO base cell on the first integrated circuit die to provide a second feedback signal to one of the second multiple input nodes of the second debug port; and
outputting to a second output node of the second debug port the second selected signal based on the configuration of the second debug port; and
wherein:
the operation includes the write operation; and
during the write operation:
a data signal is communicated from the first IO base cell to the memory, the data signal being the first feedback signal; and
a write data strobe signal is communicated from the second IO base cell to the memory, the write data strobe signal being the second feedback signal.

16. A device comprising:
a first integrated circuit die comprising a first input/output (IO) base cell, a receiver strobe cell, and a first debug port;
a second integrated circuit die comprising memory; and
an interposer, the first integrated circuit die and the second integrated circuit die being mechanically attached and electrically coupled to the interposer, wherein
each of the first IO base cell and the receiver strobe cell is configured to communicate with the memory via the interposer;
the first IO base cell has a feedback node electrically coupled to one of first multiple input nodes of the first debug port, and is configurable to selectively transmit a signal on the feedback node;
the receiver strobe cell has a read strobe observation node electrically coupled to one of the first multiple input nodes of the first debug port; and
the first debug port has a first output node, the first debug port being configurable to selectively output to a first exterior conductive element a first selected signal on a selected one of the first multiple input nodes of the first debug port.

17. The device of claim 16, wherein:
the first integrated circuit die comprises a second IO base cell, a third IO base cell, a fourth IO base cell, and a second debug port;
each of the second IO base cell, the third IO base cell, and the fourth IO base cell is configured to communicate with the memory via the interposer;
each of the second IO base cell, the third IO base cell, and the fourth IO base cell has a feedback node electrically coupled to a respective one of the first multiple input nodes of the first debug port or second multiple input nodes of the second debug port, and is configurable to selectively transmit a signal on the feedback node;
the receiver strobe cell has a true read strobe observation node and a complementary read strobe observation node each electrically coupled to a respective one of the first multiple input nodes of the first debug port or the second multiple input nodes of the second debug port; and
the second debug port has a second output node, the second debug port being configurable to selectively output to a second exterior conductive element a second selected signal on a selected one of the second multiple input nodes of the second debug port.

18. The device of claim 17, wherein each of the first IO base cell, the second IO base cell, the third IO base cell, and the fourth IO base cell comprises:
a transmission driver, the transmission driver being a tri-state binary driver; and
a receiver, the receiver being configurable to selectively receive a signal or be in an off state, an output node of the transmission driver being electrically connected to an input node of the receiver and electrically coupled to the memory, an output node of the receiver being electrically connected to the respective feedback node.

19. The device of claim 17, wherein each of the first debug port and the second debug port comprises:
a digital multiplexer, at least some of the respective one group of the first multiple input nodes of the first debug port and the second multiple input nodes of the second debug port being digital input nodes of the digital multiplexer; and a transmission driver, the transmission driver being a tri-state binary driver, an output node of the digital multiplexer being electrically connected to an input node of the transmission driver, an output node of the transmission driver being electrically coupled to the respective one of the first output node of the first debug port and the second output node of the second debug port.

20. The device of claim 19, wherein each of the first debug port and the second debug port further comprises:

an analog multiplexer, at least some of the respective one group of the first multiple input nodes of the first debug port and the second multiple input nodes of the second debug port being analog input nodes of the analog multiplexer; and a transmission gate, an output node of the analog multiplexer being electrically connected to an input node of the transmission gate, an output node of the transmission gate being electrically coupled to the respective one of the first output node of the first debug port and the second output node of the second debug port.

* * * * *